(12) United States Patent
Gilk

(10) Patent No.: US 7,059,866 B2
(45) Date of Patent: Jun. 13, 2006

(54) INTEGRATED CIRCUIT CONTACT TO TEST APPARATUS

(75) Inventor: Mathew L. Gilk, Lakeville, MN (US)

(73) Assignee: JohnsTech International Corporation, Minneapolis, MN (US)

( * ) Notice: Subject to any disclaimer, the term of this patent is extended or adjusted under 35 U.S.C. 154(b) by 0 days.

(21) Appl. No.: 10/829,577

(22) Filed: Apr. 22, 2004

(65) Prior Publication Data

US 2004/0248448 A1 Dec. 9, 2004

Related U.S. Application Data

(60) Provisional application No. 60/465,022, filed on Apr. 23, 2003.

(51) Int. Cl.
*H01R 12/00* (2006.01)
*H05K 1/00* (2006.01)

(52) U.S. Cl. ...................................................... 439/66
(58) Field of Classification Search ................... 439/65, 439/66, 68, 69, 70, 71, 72, 73, 591
See application file for complete search history.

(56) References Cited

U.S. PATENT DOCUMENTS

| 5,069,629 | A | | 12/1991 | Johnson | 439/71 |
| 5,207,584 | A | * | 5/1993 | Johnson | 439/66 |
| 5,388,996 | A | * | 2/1995 | Johnson | 439/65 |
| 5,437,556 | A | | 8/1995 | Bargain et al. | 439/66 |
| 5,594,355 | A | | 1/1997 | Ludwig | 324/755 |
| 5,634,801 | A | * | 6/1997 | Johnson | 439/71 |
| 5,749,738 | A | | 5/1998 | Johnson et al. | 439/66 |
| 6,019,612 | A | | 2/2000 | Hasegawa et al. | 439/73 |
| 6,231,353 | B1 | | 5/2001 | Rathburn | 439/66 |
| 6,244,874 | B1 | | 6/2001 | Tan | 439/66 |
| 6,572,388 | B1 | | 6/2003 | Lee | 439/71 |

FOREIGN PATENT DOCUMENTS

JP   2002-043004 A   2/2002

OTHER PUBLICATIONS

Brochure entitled *SMT type Low-inductance Socket, IC299 Series* published by Yamaichi Electronics Co. Ltd.

* cited by examiner

*Primary Examiner*—Chandrika Prasad
(74) *Attorney, Agent, or Firm*—Nawrocki, Rooney & Sivertson, P.A.

(57) ABSTRACT

A contact test set for use in testing integrated circuits. The set includes a housing having oppositely-facing surfaces and one or more slots extending through the housing between the surfaces. A first surface, during use of the test set, is approached by an integrated circuit to be tested, and a second surface is proximate the load board at a test site. A contact is received in a slot, each contact having a first end engagable by a lead of the integrated circuit device. A second end of each contact is in engagement with a corresponding terminal. Each contact is movable between a first orientation, unengaged by a corresponding lead of an IC and a second orientation in which the IC is engaged by the corresponding lead of an IC and urged into its slot. An elastomer biases the contact to its first orientation. The contact, when moved between its first and second orientations, does not slide across a terminal of the load board.

4 Claims, 1 Drawing Sheet

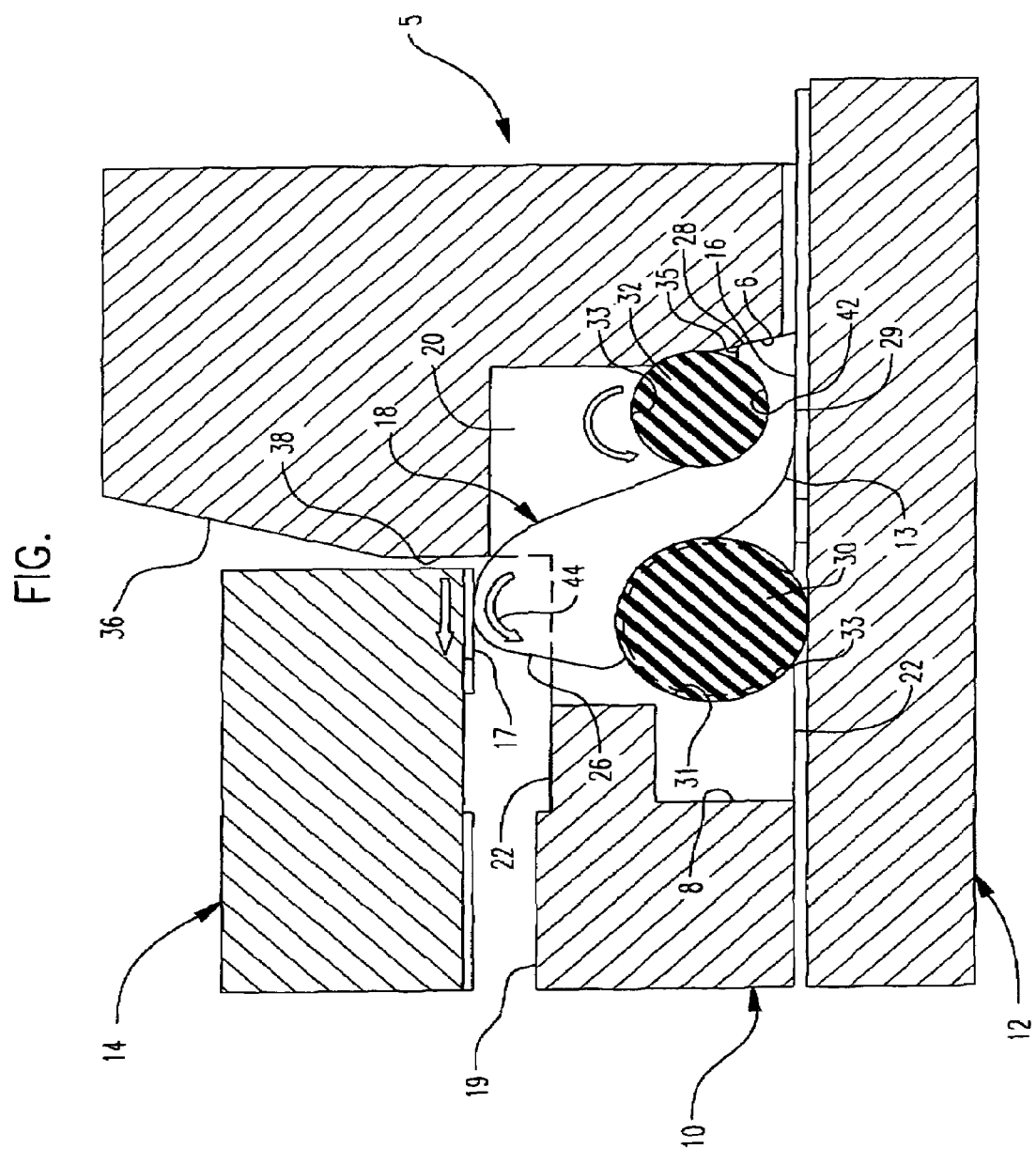

INTEGRATED CIRCUIT CONTACT TO TEST APPARATUS

This is a regular application filed under 35 U.S.C. § 111(a) claiming priority, under 35 U.S.C. § 119(e)(1), of provisional application Ser. No. 60/465,022, previously filed Apr. 23, 2003 under 35 U.S.C. § 111(b).

BACKGROUND OF THE INVENTION

1. Technical Field

The present invention relates to a connector apparatus which accomplishes interfacing of an integrated circuit with an IC test apparatus. More particularly, the present invention provides an electrical connection system which facilitates a positive connection between an IC device under test (DUT) and a load board of the test apparatus, and positive restraint of very small connectors utilized in current test apparatus.

2. Description of the Related Art

Many different test site configurations have been devised for quickly and temporarily connecting integrated circuit leads of a device to be tested to a load board of a tester. Automated test apparatus in particular use a number of such configurations. One arrangement uses force brought to bear upon a contact positioned between a lead of the IC and the load board to deform a probe tip of the contact and engage a pad on the load board. Another arrangement is to use engagement force applied by the IC to rotate a contact mounted within a slot to overcome positional bias imposed by an elastomeric element to the contact. An end of the contact opposite an end engaged by the IC contacts a pad of the load board when the IC and test site are brought together.

Such configurations provide for positive connection between leads of a DUT and corresponding leads of a test apparatus and rely upon the initial engagement between the DUT and test site to ensure a positive connection.

It would be desirable to provide a system affording additional predetermined force, in addition to that provided by initial engagement of the DUT and the test apparatus, to better ensure a positive electrical connection. Further, it would be desirable that excessive force not be required between the DUT and test site.

It is to these dictates of the prior art that the current invention is directed. The present invention is an apparatus which accommodates these dictates.

SUMMARY OF THE INVENTION

The present invention is a small pin contactor arrangement, positioned within a housing, for facilitating connecting the leads of an integrated circuit to corresponding terminals of a load board. The housing typically has a plurality of generally parallel slots for receiving a corresponding plurality of contacts, one in each slot. Each contact has a nose end that extends from its slot on one side of the housing, and a tail end that extends from its slot on an opposing side of the housing. The contacts are generally "S" shaped. A front elastomer extends through the housing along an axis generally perpendicular to the slots such that the nose of a contact curves over the front elastomer. A rear elastomer also extends along an axis generally perpendicular to the slots such that the tail of the contact curves around the rear elastomer.

The nose of the contact has a curved surface to be engaged by a lead of an integrated circuit. The tail of the contact has a flat portion for engaging a terminal pad of the load board.

In use, a lead of an integrated circuit will be made to engage the nose of a contact at the curved surface. Such action will effect compression of the front elastomer. The contact will rotate about a curved surface defined by an axis through the tail. A linear contact surface of the tail, adjacent the curved surface, is parallel to and in engagement with the terminal pad of the load board. This contact configuration tends to substantially eliminate sliding motion of the contact against the terminal pad of the load board. The engagement portion of the contact with the terminal pad moves forward as a result of the rolling of the contact, simultaneously preventing sliding between the tail and terminal pad.

The terminus of the contact tail also has a surface that engages a wall of the housing. This surface serves to positively prevent the contact from sliding along the terminal of the load board by maintaining the position of the contact relative to the housing. The front elastomer also plays a role in achieving this by urging the tail of the contact toward the housing wall and maintaining the contact seated against that wall.

The present invention is thus a contact set assembly which solves many of the problems of the prior art. It enables positive contact to be established along electrical paths, yet it minimizes erosion of a lead of a load board 12.

BRIEF DESCRIPTION OF THE DRAWING

The objects and features of the present invention will become more apparent to those skilled in the art upon reference to the following description, taken in conjunction with the accompanying drawing wherein like reference numerals refer to the same part or feature, and wherein:

The FIGURE is a cross-section view of the present invention.

DETAILED DESCRIPTION OF THE INVENTION

A contactor assembly 5, as shown in the FIGURE, is mounted in a housing 10. Housing 10 has generally planar, parallel opposed sides 22 essentially at right angles to pairs of opposed edges. Housing 10 is configured to effect electrical connection of an integrated circuit device (DUT) 14 to a load board 12. Device 14 has leads 17 and load board 12 has terminals or pads 16 which are electrically connected by contacts 18 mounted within housing 10.

Parallel sides of housing 10 bound generally equally spaced parallel slots 20, each for receiving a corresponding contact 18 therein.

Each slot 20, it is intended, contains a contact 18. Contacts 18 are thin with generally planar surfaces. Each has a nose end 26 and a tail end 28 which together define an essentially "S" shaped structure. Nose end 26 is, as illustrated, larger than tail end 28 to provide a greater outward extension to protrude from housing 10 beyond one side to contact leads 17 of device 14. Tail end 28 has a linear portion 29 to provide a positive electrical connection to terminals 16 of lead board 12.

Generally tubular shaped channels 31 and 33 extend through housing 10 along axes generally perpendicular to planes defined by slots 20 with front channel 31 being larger than rear channel 33 to better conform to the corresponding concave portion of edges of engaged nose ends 26 and tail ends 28. A cylindrical shaped front elastomer 30 is received within front channel 31, and a cylindrical shaped rear elastomer 32 is received within rear channel 33.

Nose end 26 has a concave inner edge 25 which engages and bears against front elastomer 30. Similarly, tail end 28 has a concave inner edge 42 which engages and bears against rear elastomer 32. Front channel 31 and rear channel 33 have corresponding communicating apertures 33, 35 extending through to load board 12. Proximate sides of channels 33, 35 are spaced closer than distances the same as the diameters of their respective channels 31, 33. This permits inserting elastomers 30 and 32 into channels 31, 33 by urging them through their respective apertures 33, 35. Elastomers 30, 32 are thereby retained in place.

An alignor 36 extends across an outer portion of housing 10 proximate the nose end 26 of the contact 18. The portion of the alignor 26 opposite contacts 18 defines a stop 38. The alignor 36 locates an edge of DUT 14 such that its leads 17 are opposite the outward extensions of corresponding nose ends 26 of contacts 18, and also orients the leads 17 parallel to the contacts 18. Stop 38 also limits the outward extension of contacts 18.

DUT 14 is positioned proximate housing 10 in the position and orientation shown in the FIGURE. Apparatus, not shown, determines the precise location of device 14 relative to surface 19 of housing 10 such that each lead 17 is directly opposite a contact 18. DUT 14 is then moved closer to housing 10 as shown in the FIGURE. This effects engagement of the device 14 and the nose end 26 of a corresponding contact 18. Contacts 18 are thus rotated, their nose ends 26 engaged by opposing leads 17 and their tail ends 28 engaging terminals 16. This rotation of contacts 18 will also result in flat portion 29 of each rising up slightly at one end as its contact rolls counterclockwise, as shown by arrow 44 in the FIGURE.

Such action results in front elastomer 30 and rear elastomer 32 both being compressed. Since the diameters and characteristics of the elastomers are selectable, the amount of force required to compress the elastomers can be preselected. This force is chosen so as to be sufficient to provide a good electrical connection between the leads and terminals.

In the dual elastomer configuration as pictured in the FIGURE, the front elastomer 30 provides flexibility in controlling contact force by the device 14 in addition to aiding in keeping the contact tail 28 engaged against a wall surface 6. In this configuration the front elastomer 30 is fully in compression. As the front elastomer 30 is compressed, the displaced material can expand into an elastomer relief area 8. The rear elastomer 32 can be configured and used in either tension or compression.

The front elastomer 30 can play a significant role in preventing contacts 18 from being easily released from the housing 10 while the contacts 18 are not engaged by DUT 14, as after implacement. A contact 18 is rotated clockwise, and the contact 18 is then pinched between the front elastomer 30 and alignor 36. As a contact 18 is removed from the bottom, both the front and rear elastomers 30, 32 need to be compressed to permit the contact 18 to pass between the two.

This contactor system has been designed to prevent contact translational relative motion (sliding) against the load board 28. Sliding motion causes wear on the load board pads, an undesirable characteristic. The sloped terminus of contact tail 6 in engagement with housing wall 15 is instrumental in preventing the contact 18 from sliding along the load board 12. The front elastomer 30 also plays a role in helping achieve this end by forcing the contact 18 in a direction to remain seated against wall 15 of the housing 10.

Rather than sliding along leads 17 as contacts of previous contactors do, the contact motion in the present invention is a rolling action. As the contact 18 compresses the elastomers, the point of contact between the lead 17 and the contact tail 28 walks forward on the load board 12 (translates horizontally) and travels along the lower contact arc 13.

The flat portion 29 of the contact tail design 28 controls location of contact nose 26 while allowing the contact nose 26 to be pre-loaded in the uncompressed state, as illustrated in the FIGURE. The flat portion 29 of the contact tail 28 constrains the contact 18 from achieving an ultimate rolling equilibrium position, and allows the partial compression of the front elastomer 30 without sliding of the tail 28 with respect to the load board 12. This creates immediate contact force at the load board 12, which improves the effective compliance range (operating range) of the contactor system.

In lieu of a flat portion 29 on the contact tail 28, the alignor 38 can be used to control the contact nose 26 position and provide the necessary constraint to facilitate pre-loading the nose 26 of the contact 18.

This design can be alternatively configured as a single elastomer system. In this configuration the rear elastomer 32 would define the applicable force necessary at both the contact nose 26 and contact tail 28. The design of housing 10 and contact 18 would be modified from the FIGURE to facilitate this configuration option. The rear elastomer 32, again, can be placed in either tensile extension or compression.

It will be understood that this disclosure, in many respects, is only illustrative. Changes may be made in details, particularly in matters of shape, size, material, and arrangement of parts without exceeding the scope of the invention. Accordingly, the scope of the invention is as defined in the language of the appended claims.

What is claimed is:

1. Apparatus for electrically connecting a lead of the integrated circuit to be tested to a corresponding terminal of a load board at a test site, comprising:
   a housing having oppositely facing surfaces, a first approachable by an integrated circuit to be tested and a second proximate the load board, a slot extend through said housing from a first of said oppositely facing surfaces to a second of said oppositely facing surfaces;
   a contact receivable in said slot having a first end engagable by the lead and a second end in engagement with the terminal, said contact being rollable across the terminal between a first orientation unengaged by the lead of the integrated circuit and a second orientation in which said first end of said contact is engaged by the lead of the integrated circuit and urged into said slot; and
   means for biasing said contact to said first orientation, wherein, as said contact is rolled between said first and said second orientations thereof, sliding motion of said second end of said contact across the terminal is substantially eliminated.

2. Apparatus in accordance with claim 1 wherein said contact is generally S-shaped.

3. Apparatus in accordance with claim 2 wherein said means for biasing comprises a first elastomer interfacing with said first end of said contact and a second elastomer interfacing with said second end of said contact.

4. Apparatus in accordance with claim 3 wherein said second end of said contact includes a protrusion, and wherein said housing defines a wall engaged by said protrusion to substantially eliminate sliding motion of said second end of said contact across the terminal.

* * * * *